(12) United States Patent
Krieg

(10) Patent No.: US 9,395,416 B2
(45) Date of Patent: Jul. 19, 2016

(54) METHOD FOR DETERMINING A CHARGE STATE OF A BATTERY

(75) Inventor: Berengar Krieg, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 416 days.

(21) Appl. No.: 13/816,666

(22) PCT Filed: Aug. 4, 2011

(86) PCT No.: PCT/EP2011/063433
§ 371 (c)(1),
(2), (4) Date: May 6, 2013

(87) PCT Pub. No.: WO2012/019960
PCT Pub. Date: Feb. 16, 2012

(65) Prior Publication Data
US 2013/0241564 A1 Sep. 19, 2013

(30) Foreign Application Priority Data

Aug. 13, 2010 (DE) .......................... 10 2010 039 326

(51) Int. Cl.
*H02J 7/14* (2006.01)
*G01R 31/36* (2006.01)

(52) U.S. Cl.
CPC ........ *G01R 31/3606* (2013.01); *G01R 31/3613* (2013.01)

(58) Field of Classification Search
USPC .............................. 320/104, 116, 139; 307/49
See application file for complete search history.

(56) References Cited

U.S. PATENT DOCUMENTS

| 5,321,627 | A  | * | 6/1994 | Reher .............................. 702/63 |
| 7,994,908 | B2 | * | 8/2011 | Tonegawa et al. ............ 340/538 |
| 2004/0135544 | A1 | * | 7/2004 | King et al. ..................... 320/116 |
| 2004/0189248 | A1 | * | 9/2004 | Boskovitch et al. .......... 320/116 |
| 2006/0132140 | A1 | * | 6/2006 | Weber ............................ 324/433 |

FOREIGN PATENT DOCUMENTS

| DE | 199 12 300 A1 | 9/2000 |
| DE | 10 2007 026 134 A1 | 2/2008 |
| EP | 0 794 438 A2 | 9/1997 |
| JP | 2-56622 A | 2/1990 |
| JP | 11-283677 A | 10/1999 |

(Continued)

OTHER PUBLICATIONS

Information provided on the European Patent Office Website (Espacenet) regarding "Battery Condition Detector," Yazaki Corp., Sep. 13, 2005.

(Continued)

*Primary Examiner* — Yalkew Fantu
(74) *Attorney, Agent, or Firm* — Maginot, Moore & Beck LLP

(57) ABSTRACT

The disclosure relates to a method for determining a charge state of a battery having a battery management unit. In a first operating state of the battery management unit, a battery current is regularly detected by the battery management unit. The battery management unit switches to a second operating state when the battery current exceeds a predetermined current threshold value. In the second operating state, information about the charge state of the battery is collected. Furthermore, a battery having a battery management unit is described, which is configured to carry out the method according to the disclosure.

10 Claims, 3 Drawing Sheets

(56) References Cited

FOREIGN PATENT DOCUMENTS

| JP | 2007-078443 | * | 3/2007 |
| JP | 2007-78443 A | | 3/2007 |
| WO | 2005/111642 A1 | | 11/2005 |
| WO | 2009/096565 A1 | | 8/2009 |

OTHER PUBLICATIONS

International Search Report corresponding to PCT Application No. PCT/EP2011/063433, mailed Dec. 19, 2011 (German and English language document) (7 pages).

* cited by examiner

METHOD FOR DETERMINING A CHARGE STATE OF A BATTERY

This application is a 35 U.S.C. §371 National Stage Application of PCT/EP2011/063433, filed on Aug. 4, 2011, which claims the benefit of priority to Serial No. DE 10 2010 039 326.6, filed on Aug. 13, 2010 in Germany, the disclosures of which are incorporated herein by reference in their entirety.

The present disclosure relates to a method for determining a state-of-charge of a battery, a battery that is embodied for the purpose of performing the method in accordance with the disclosure, and a motor vehicle having the battery in accordance with the disclosure.

BACKGROUND

Different methods for determining a state-of-charge of a battery are known from the prior art. In the case of one of these known methods, the battery state is determined by virtue of the fact that the voltage of the battery that is not under any load, also called OCV (open circuit voltage) is measured. In parts, this is compared in addition with the voltage of the battery when the battery is under a load. The method is relatively reliable when the state-of-charge has a steep dependency on the voltage of the battery that is not under any load, but it is unsuitable for use in battery systems that comprise a flat progression such as is illustrated in FIG. 1 using an example of a battery that is lithium-iron-phosphate based.

In the case of a further method for determining the state-of-charge of a battery, a battery current that is flowing through the battery is measured and integrated over time. A method of this type is used, for example, in battery systems that can be disconnected from the consumer network when not in use. An inactive operating mode of this type can then prevail if a superimposed control unit, for example an engine control unit in a motor vehicle, is switched off. If it is necessary for the battery system to meet a particular demand for a stand-by current, the battery can be noticeably discharged when the battery electronics are in an inactive operating mode of this type. In order for the state-of-charge to be determined in a sufficiently precise manner, it is necessary for a component that is performing the integration of the battery current over time to be permanently active which would lead to an increased discharge of the battery during the inactive operating mode.

SUMMARY

In accordance with the disclosure, a method is provided for determining a state-of-charge of a battery having a battery management unit. In a first operating mode of the battery management unit, a battery current is regularly and accordingly continuously sensed by means of the battery management unit. The battery management unit switches into a second operating mode if the battery current exceeds a predetermined current threshold value. Information regarding the state-of-charge of the battery is collected in the second operating mode. Ideally, the state-of-charge of the battery is completely determined.

The term 'battery management unit' includes above all battery management systems that are used in higher-performance batteries, for example for traction networks in hybrid vehicles. However, the term 'battery management unit' also covers battery sensor systems in particular batteries that are used for example in start-stop applications in motor vehicles. The method in accordance with the disclosure can also be performed using battery sensor systems of this type provided that they are embodied for the purpose of collecting information regarding the state-of-charge of the battery.

The method in accordance with the disclosure represents a wakeup mechanism of the battery management unit. In contrast to already known wakeup mechanisms that initiate the battery management unit into an active operating mode by means of a wakeup signal, which is transmitted by way of a communication protocol or a hardware line, the method in accordance with the disclosure provides a wakeup mechanism that functions inside the battery.

The method in accordance with the disclosure has the advantage that in the first operating mode the discharge of the battery is maintained at a low level. The first operating mode corresponds in this case typically to an inactive operating mode in which the battery system is not used or is used only to a small extent but nonetheless remains connected to the consumer network either because it has been decided not to disconnect the battery system from the consumer network or because it is not necessary to disconnect the battery system since the system voltage is sufficiently low.

It is normally not necessary in the first operating mode to collect information regarding the state-of-charge of the battery. In the first operating mode it is preferred that no functions are performed in addition to sensing the battery current. Consequently, the first operating mode is the operating mode of the battery management unit where the maximum amount of energy is saved.

Information regarding the state-of-charge of the battery can be collected in the second operating mode by integrating the battery current over time. In addition, however, the second operating mode can likewise function in an energy-saving manner in that at least one function of the battery management unit is disabled, said function being a function that the battery management unit can perform in a third operating mode, in particular in a fully operating mode. For example, the communication with a control unit that is superimposed on the battery management unit can be prevented in the second operating mode, whereas it is activated in the fully operating mode.

The superimposed control unit can, however, switch the battery management unit into the third operating mode, in particular by means of transmitting a wakeup signal. This can occur, for example, on a controller area network (CAN)-bus.

The battery management unit can be operated in the first operating mode at a lower pulse frequency than in the second operating mode. The electronics can even remain deactivated until a continuously functioning, non-pulsed switching occurs, which switching monitors the battery current to check if it exceeds a threshold value. Likewise, the battery management unit can be operated in the second operating mode at a lower pulse frequency than in the third operating mode, which third operating mode corresponds normally to the full operating mode.

The battery management unit can switch from the second operating mode into the first operating mode if the battery current is in turn below the predetermined current threshold value.

A further aspect of the disclosure relates to a battery, preferably a lithium-ion battery, which battery comprises a battery management unit having a current sensor. The battery management unit is embodied for the purpose of performing the method in accordance with the disclosure.

It is preferred that the current sensor comprises a passive component, in particular a shunt resistor. This has the advantage that the battery management unit can also be operated in the first operating mode where the current requirement is low and current measurements that are required for performing the method can be evaluated in an energy-saving manner. The battery current can be monitored by means of a comparator which requires a sufficiently low current consumption of a few µA to check if it has exceeded the predetermined current threshold value (for example 0.5 to 2 A). In this case, the current is to be monitored both in the discharging direction and also in the charging direction.

A further aspect of the disclosure relates to a motor vehicle that comprises the battery in accordance with the disclosure.

BRIEF DESCRIPTION OF THE DRAWINGS

Exemplary embodiments of the disclosure are explained in detail with reference to the drawings and the description hereinunder. In the drawings.

DETAILED DESCRIPTION

Figure 1:
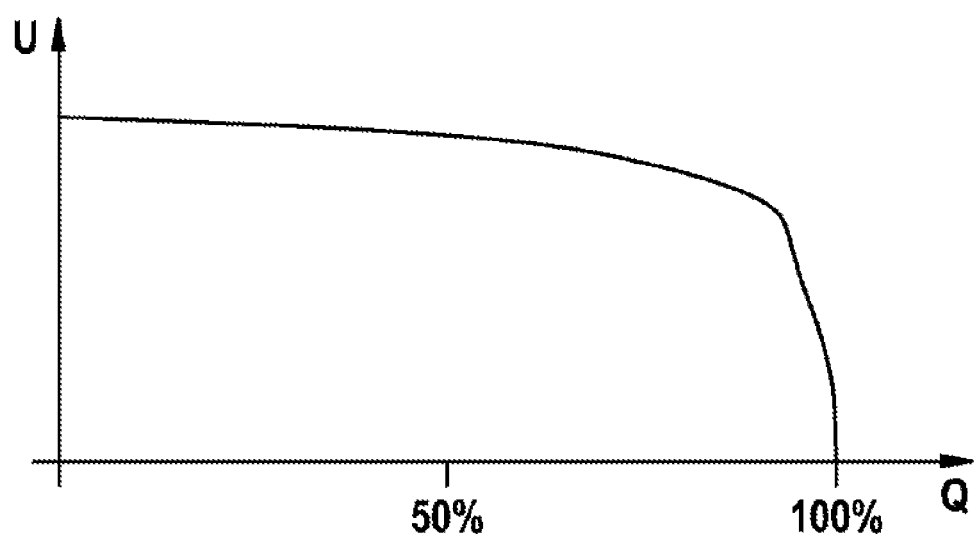
FIG. 1 shows a progression of the voltage of a battery that is not under any load and is lithium-iron-phosphate based in dependence upon the state-of-charge of the battery.
Figure 2:
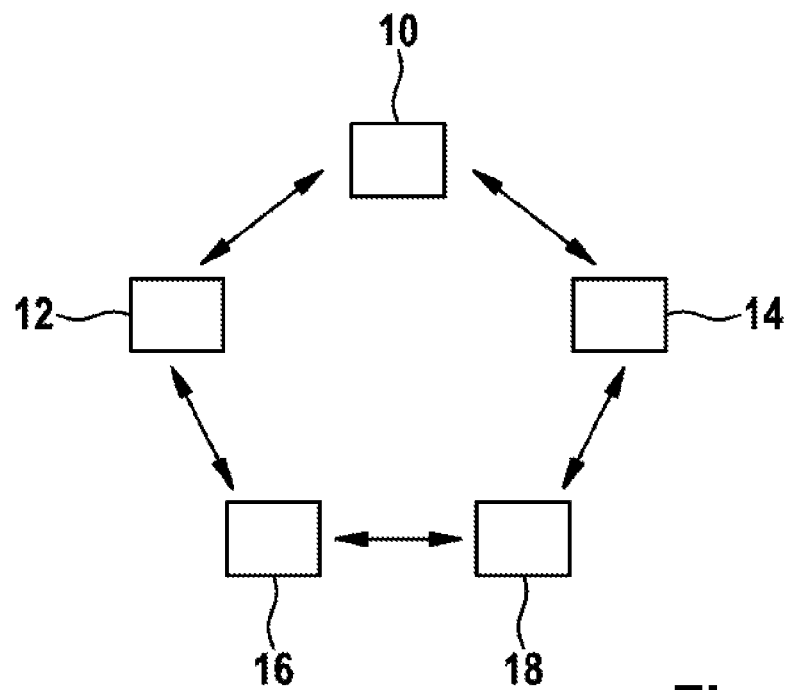
FIG. 2 shows different operating modes of a motor vehicle.

FIG. 2 illustrates five possible operating modes in a non-hybridized motor vehicle that comprises a battery (car battery or starter battery).

A first operating mode 10 corresponds to a parked state of the motor vehicle, in which the battery must meet a requirement for stand-by current of typically 10 to 60 mA during a stand time of up to six weeks.

A second operating mode of the motor vehicle 12 corresponds to a battery being discharged when the ignition is switched off and consequently also the superimposed control unit, for example, engine control unit, is switched off, wherein consumers such as interior lights, vehicle lights, warning lights or radio consume a current of a few 100 mA to several A during a period of time of a few minutes up to several hours.

A third operating mode of the motor vehicle 14 corresponds to the battery being discharged when the ignition is switched on or any other superimposed control unit is switched on, wherein a current of a few 100 mA up to several A can flow for a few seconds up to several minutes.

A fourth operating mode of the motor vehicle 16 corresponds to the battery being charged when the ignition is switched on and the superimposed control unit is switched on with the combustion engine running.

Finally, a fifth operating mode of the motor vehicle 18 corresponds to the battery being charged when the ignition is switched off and the superimposed control unit is switched off, for example, when the battery is being charged by means of an external charging device.

It is possible to switch at any time between the individual operating modes 10 to 18 (illustrated only schematically in FIG. 2). The state-of-charge of the battery can only be determined in the operating modes 14 and 16 in accordance with the prior art with a justifiable energy consumption, since the superimposed control unit is switched on in these modes and the motor vehicle is not in an energy-saving mode. In contrast, the state-of-charge of the battery having battery management units that are known in the prior art cannot be determined in the operating modes 10, 12 and 18 since these operating modes comprise a power consumption of up to 20 W during operation and consequently cause an excessively high loading on the battery capacity.

Figure 3:
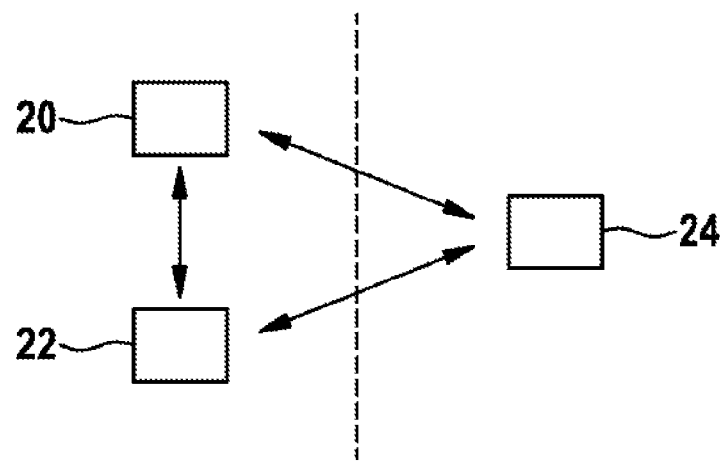
FIG. 3 shows different operating modes of a battery management unit in accordance with an exemplary embodiment of the disclosure.

FIG. 3 illustrates different operating modes of a battery management unit in accordance with an exemplary embodiment of the disclosure.

In a first operating mode of the battery management unit 20, said battery management unit is in an energy-saving mode. A battery current is measured and compared with a current threshold value. In addition, the battery management unit is performing only a few functions or no functions at all. Communication with the superimposed control unit is prevented.

In a second operating mode of the battery management unit 22, said battery management unit is likewise in an energy-saving mode. The battery current is measured and integrated over time in order to determine the state-of-charge of the battery. In addition, the battery management unit is performing only a few functions or no functions at all. If necessary, the aging of the battery is calculated. A power prediction is not provided. Communication with the superimposed control unit is also prevented here.

The first or second operating mode of the battery management unit 20 and 22 respectively is assumed if the superimposed control unit of the motor vehicle is switched off, i.e. in one of the operating modes 10, 12 and 18 of the motor vehicle. If the motor vehicle is switched into one of the operating modes 14 or 16 in which the superimposed control unit is switched on, then said control unit can activate the battery management unit by emitting a wakeup signal on a CAN-bus, local interconnect network (LIN)-bus, on any other developed bus system or a hardware wakeup line to which bus system and accordingly to which hardware wakeup line the two components are connected and switch said battery management unit into a third operating mode 24, which third operating mode corresponds to a fully operating mode. It is also possible to switch back from the third operating mode 24 into the first or second operating mode of the battery management unit 20 and 22 respectively.

Figure 4:
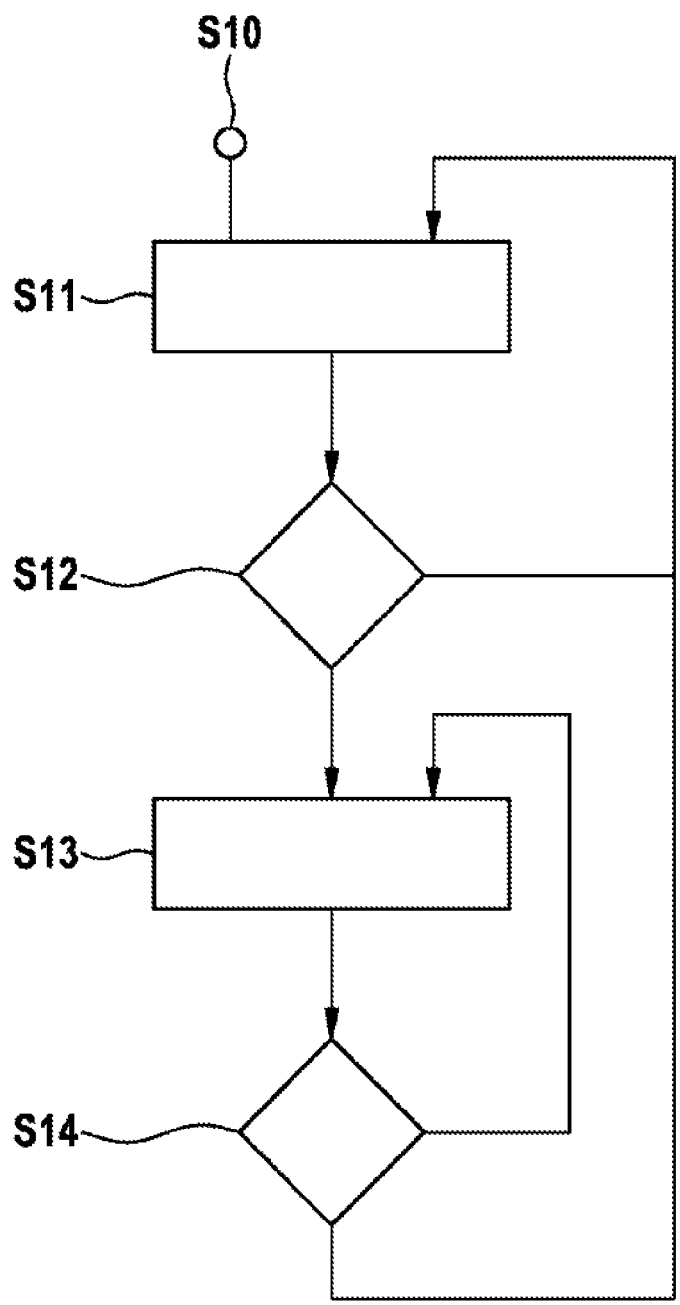
FIG. 4 shows a flow chart of the method in accordance with the disclosure for determining the state-of-charge of a battery in accordance with an exemplary embodiment.

FIG. 4 illustrates an exemplary embodiment of a method in accordance with the disclosure for determining a state-of-charge of a battery. The method commences in step S10 if the motor vehicle is in one of the operating modes 10, 12 or 18 and thus the control unit that is superimposed on the battery is switched off. The battery management unit of the battery is in this case in the first operating mode 20, in which the battery management unit senses only the battery current (S11) but does not perform any functions in addition thereto.

The sensed battery current is compared in step S12 with a predetermined current threshold value. If the sensed battery current is not greater than the predetermined current threshold value, the method then loops back to the commencement of the method in step S11, otherwise it switches in step S13 into the second operating mode of the battery management unit 22 in which the battery current is integrated over time in order as a consequence to determine the state-of-charge of the battery. The battery management unit is fundamentally inactive also in its second operating mode 22, in other words, it determines only the state-of-charge of the battery but does not perform any other functions or performs them only to a small extent. In particular, communication with the superimposed control unit is disabled in the second operating mode of the battery management unit 22 and accordingly can only be received by the superimposed control unit itself.

The sensed battery current is compared in step S14 with the predetermined current threshold value. If the sensed battery current is not less than the predetermined current threshold value, the state-of-charge of the battery continues to be determined (S13) otherwise the method switches back into the first operating mode of the battery management unit 20 (S11).

The error that arises as a result of the fact that the state-of-charge is not determined in the first operating mode of the battery management unit 20 can be estimated by means of the duration of the phase in which the battery management unit is in the first operating mode 20 since the battery current flowing in this operating mode is relatively constant. For example, a maximum error can be calculated as the product of the current threshold value and the duration of said phase.

The invention claimed is:

1. A method for determining a state-of-charge of a battery having a battery management unit and a superimposed control unit, the battery management unit being operated in three operating modes, the method comprising:
    in a first operating mode, regularly sensing a battery current by means of the battery management unit;
    in a second operating mode, collecting information regarding the state-of-charge of the battery and determining the state-of-charge of the battery when the battery management unit is in the second operating mode and disabling at least one function that is to be performed by the battery management unit in a third operating mode, the at least one function being communication with the superimposed control unit, and
    in a third operating mode, sensing the battery current, determining the state-of-charge of the battery, performing a power prediction, and communicating with the superimposed control unit,
    wherein the battery management unit switches from the first operating mode to the second operating mode if the battery current exceeds a predetermined current threshold value,
    wherein the superimposed control unit is switched off in the first and the second operating modes, and
    wherein switching on the superimposed control unit switches the battery management unit into the third operating mode.

2. The method as claimed in claim 1, wherein the information regarding the state-of-charge of the battery is not collected in the first operating mode.

3. The method as claimed in claim 1, wherein the information regarding the state-of-charge of the battery is collected in the second operating mode by integrating the battery current over time.

4. The method as claimed in claim 1, wherein in the first operating mode the battery management unit does not perform any functions in addition to regularly sensing the battery current.

5. The method as claimed in claim 1, wherein a superimposed control unit switches the battery management unit into the third operating mode by means of transmitting a wakeup signal.

6. The method as claimed in claim 1, wherein:
    the battery management unit is operated in the first operating mode at a lower pulse frequency than in the second operating mode, and
    the battery management unit is operated in the second operating mode at a lower pulse frequency than in the third operating mode.

7. The method as claimed in claim 1, further comprising:
    switching the battery management unit from the second operating mode into the first operating mode if the battery current is below the predetermined current threshold value.

8. A battery comprising:
    a battery management unit configured to be operated in three operating modes and having a current sensor, and
    a superimposed control unit,
    wherein the battery management unit is configured to perform a method for determining a state-of-charge of the battery,
    wherein the method includes:
        (i) in a first operating mode, regularly sensing a battery current by means of the battery management unit,
        (ii) in a second operating mode, collecting information regarding the state-of-charge of the battery and determining the state-of-charge of the battery when the battery management unit is in the second operating mode, and disabling at least one function that is to be performed by the battery management unit in a third operating mode, the at least one function being communicating with the superimposed control unit, and
        (iii) in a third operating mode, sensing a battery current using the current sensor, determining the state-of-charge of the battery, performing a power prediction, and communicating with the superimposed control unit,
    wherein the battery management unit switches from the first operating mode to the second operating mode if the battery current exceeds a predetermined current threshold value,
    wherein the superimposed control unit is switched off in the first and the second operating modes, and
    wherein switching on the superimposed control unit switches the battery management unit into the third operating mode.

9. The battery as claimed in claim 8, wherein:
the current sensor comprises a passive component, and
the passive component includes a shunt resistor.

10. A motor vehicle comprising:
a battery including:
    a battery management unit configured to be operated in three operating modes and having a current sensor, and
    a superimposed control unit,
wherein the battery management unit is configured to perform a method for determining a state-of-charge of the battery,
wherein the method includes:
    (i) in a first operating mode, regularly sensing a battery current by means of the battery management unit,
    (ii) in a second operating mode, collecting information regarding the state-of-charge of the battery and determining the state-of-charge of the battery when the battery management unit is in the second operating mode, and disabling at least one function that is to be performed by the battery management unit in a third operating mode, the at least one function being communicating with the superimposed control unit, and
    (iii) in a third operating mode, sensing a battery current using the current sensor, determining the state-of-charge of the battery, performing a power prediction, and communicating with the superimposed control unit,
wherein the battery management unit switches from the first operating mode to the second operating mode if the battery current exceeds a predetermined current threshold value,
wherein the superimposed control unit is switched off in the first and the second operating modes, and
wherein switching on the superimposed control unit switches the battery management unit into the third operating mode.

* * * * *